(12) United States Patent
Srinivasan et al.

(10) Patent No.: US 10,977,186 B2
(45) Date of Patent: Apr. 13, 2021

(54) LAST WRITTEN PAGE SEARCHING

(71) Applicant: Micron Technology, Inc., Boise, ID (US)

(72) Inventors: Dheeraj Srinivasan, San Jose, CA (US); Ali Mohammadzadeh, Mountain View, CA (US); Michael G. Miller, Boise, ID (US); Xiaoxiao Zhang, San Jose, CA (US); Jung Sheng Hoei, Newark, CA (US)

(73) Assignee: Micron Technology, Inc., Boise, ID (US)

( * ) Notice: Subject to any disclaimer, the term of this patent is extended or adjusted under 35 U.S.C. 154(b) by 16 days.

(21) Appl. No.: 15/819,941

(22) Filed: Nov. 21, 2017

(65) Prior Publication Data

US 2019/0155744 A1 May 23, 2019

(51) Int. Cl.
| | |
|---|---|
| *G06F 12/02* | (2006.01) |
| *G06F 3/06* | (2006.01) |
| *G06F 12/1009* | (2016.01) |
| *G11C 11/56* | (2006.01) |
| *G06F 11/07* | (2006.01) |

(52) U.S. Cl.
CPC ............ *G06F 12/1009* (2013.01); *G06F 3/06* (2013.01); *G06F 11/0793* (2013.01); *G06F 12/0246* (2013.01); *G11C 11/56* (2013.01); *G06F 2212/1032* (2013.01); *G06F 2212/7201* (2013.01); *G06F 2212/7202* (2013.01); *G06F 2212/7207* (2013.01); *G11C 11/5628* (2013.01); *G11C 2211/5641* (2013.01); *G11C 2211/5648* (2013.01)

(58) Field of Classification Search
CPC ......... G06F 12/1009; G06F 2212/1032; G06F 2212/7201; G06F 2212/7202; G06F 2212/7207; G06F 3/06; G06F 12/0246; G06F 11/0793; G11C 2211/5648; G11C 11/5628; G11C 2211/5641; G11C 11/56
See application file for complete search history.

(56) References Cited

U.S. PATENT DOCUMENTS

| | | | | |
|---|---|---|---|---|
| 6,282,624 B1 * | 8/2001 | Kimura | ............... | G06F 12/0246 711/202 |
| 8,327,224 B2 * | 12/2012 | Larsen | ................. | G06F 11/108 714/763 |
| 8,873,288 B2 * | 10/2014 | Sharon | ................ | G11C 11/5642 365/185.03 |
| 9,543,033 B1 * | 1/2017 | Shinohara | .............. | G11C 16/10 |
| 2009/0067241 A1 * | 3/2009 | Gorobets | ............ | G06F 11/1441 365/185.04 |

(Continued)

*Primary Examiner* — Charles Rones
*Assistant Examiner* — Tong B. Vo
(74) *Attorney, Agent, or Firm* — Brooks, Cameron & Huebsch, PLLC

(57) ABSTRACT

An example method of the present disclosure includes, responsive to a loss of last written page information by a memory system, initiating a last written page search to determine last written page information of a memory device, where the last written page search is initiated via a command from a controller of the memory system to the memory device, responsive to receiving the command, performing the last written page search on the memory device, and providing the last written page information to the controller.

22 Claims, 5 Drawing Sheets

(56) References Cited

U.S. PATENT DOCUMENTS

| | | | |
|---|---|---|---|
| 2009/0150646 A1* | 6/2009 | Allen | G06F 12/0246 |
| | | | 711/213 |
| 2015/0261613 A1* | 9/2015 | Tuers | G06F 9/4401 |
| | | | 713/2 |
| 2017/0084328 A1* | 3/2017 | Hsu | G11C 11/5628 |
| 2017/0293437 A1* | 10/2017 | Lo | G06F 3/0613 |
| 2017/0310341 A1* | 10/2017 | Yuan | H03M 13/1105 |
| 2018/0210653 A1* | 7/2018 | Parthasarathy | G06F 3/0611 |
| 2018/0293174 A1* | 10/2018 | Song | G06F 12/0246 |
| 2019/0108090 A1* | 4/2019 | Shen | G06F 11/1048 |

* cited by examiner

531

|  | SB0 | SB1 | SB2 | SB3 | SB4 | SB5 |
|---|---|---|---|---|---|---|
| WL10 | (60) | 61 | 62 | 63 | 64 | 65 |
| WL9 | 54 | 55 | 56 | 57 | 58 | 59 |
| WL8 | 48 | 49 | 50 | 51 | 52 | 53 |
| WL7 | (42) | 43 | 44 | 45 | 46 | 47 |
| WL6 | (36) | (37) | (38) | 39 | 40 | (41) |
| WL5 | (30) | 31 | 32 | 33 | 34 | 35 |
| WL4 | 24 | 25 | 26 | 27 | 28 | 29 |
| WL3 | 18 | 19 | 20 | 21 | 22 | 23 |
| WL2 | 12 | 13 | 14 | 15 | 16 | 17 |
| WL1 | 6 | 7 | 8 | 9 | 10 | 11 |
| WL0 | (0) | 1 | 2 | 3 | 4 | 5 |

|  | SB0 | SB1 | SB2 | SB3 | SB4 | SB5 |
|---|---|---|---|---|---|---|
| WL10 | E | E | E | E | E | E |
| WL9 | E | E | E | E | E | E |
| WL8 | E | E | E | E | E | E |
| WL7 | E | E | E | E | E | E |
| WL6 | P | P | E | E | E | E |
| WL5 | P | P | P | P | P | P |
| WL4 | P | P | P | P | P | P |
| WL3 | P | P | P | P | P | P |
| WL2 | P | P | P | P | P | P |
| WL1 | P | 7 | 8 | 9 | P | P |
| WL0 | P | P | P | P | P | P |

FIG. 5B

LAST WRITTEN PAGE SEARCHING

TECHNICAL FIELD

The present disclosure relates generally to systems, such as memory systems, and methods, and more particularly, to methods and apparatus involving last written page searching.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), electrically erasable programmable ROM (EEPROM), erasable programmable ROM (EPROM), and resistance variable memory such as phase change random access memory (PCRAM), resistive random access memory (RRAM), and magnetoresistive random access memory (MRAM), among others.

Memory devices can be combined to form a storage volume of a memory system, such as a solid-state drive (SSD). As an example, an SSD can include non-volatile memory (e.g., NAND flash memory and NOR flash memory), and/or can include volatile memory (e.g., DRAM and SRAM), among various other types of non-volatile and/or volatile memory.

An SSD can be used to replace hard disk drives as the main storage volume for a computer, as the SSD can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives.

In various memory systems, it can be beneficial to maintain certain information such that it can be retrieved when needed. However, it may be difficult to obtain and/or access such information due to occurrence of various events, which may be unexpected and/or unpredictable. For instance, loss of such information may result from a loss of power (e.g., an asynchronous power loss event). Some memory systems may include a mechanism such as a hold up capacitance that can be used to write such information to nonvolatile storage such that it is not lost due to a power loss event. However, if the system does not include a mechanism such as hold up capacitance, which may allow the information to be retrieved from nonvolatile storage, the system may attempt to determine such information at power up (e.g., as part of a "rebuild" process).

However, retrieving such information at power up can take time and resources, which can adversely affect system performance. For instance, determining such information at power up can increase the time-to-ready (TTR), which can be part of a product specification and can refer to the time required before a memory system is ready to accept commands (e.g., from a host).

BRIEF DESCRIPTION OF THE DRAWINGS

FIG. 5A illustrates an example page map associated with last written page searching in accordance with a number of embodiments of the present disclosure.

FIG. 5B illustrates a table indicating erase status of physical pages corresponding to the page map shown in FIG. 5A.

DETAILED DESCRIPTION

Figure 1:
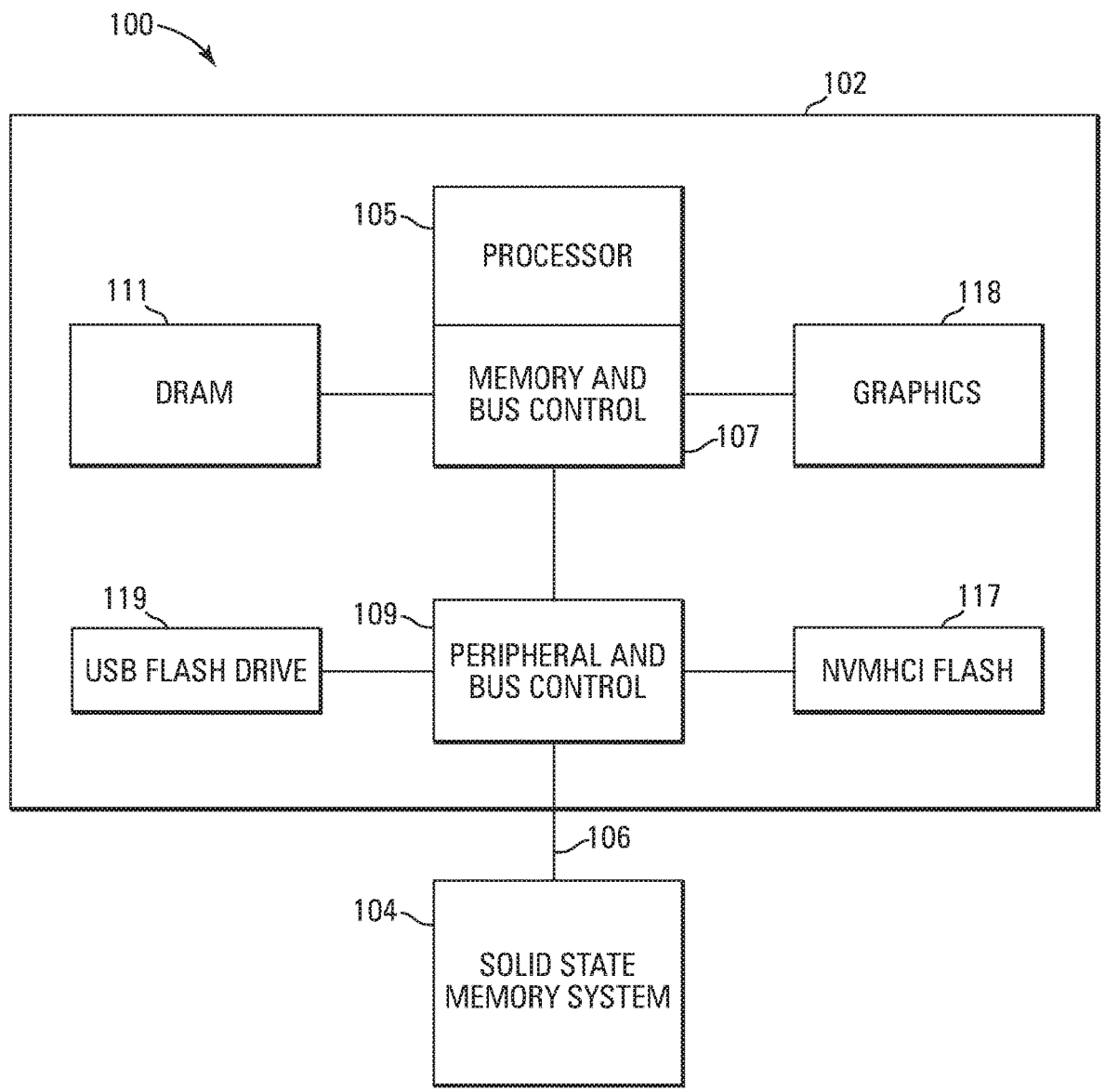
FIG. 1 is a block diagram of an apparatus in the form of a computing system including at least one memory system in accordance a number of embodiments of the present disclosure.

An example method of the present disclosure includes, responsive to a loss of last written page information by a memory system, initiating a last written page search to determine last written page information of a memory device, where the last written page search is initiated via a command from a controller of the memory system to the memory device, responsive to receiving the command, performing the last written page search on the memory device, and providing the last written page information to the controller.

A number of embodiments of the present disclosure can provide benefits, such as reducing a TTR of a memory system and/or input/output (I/O) traffic within the memory system, as compared to prior approaches. For instance, a number of embodiments can perform a last written page (LWP) search internal to memory devices coupled to a system controller, as opposed to by using the system controller itself.

For example, some prior approaches include the system controller executing a process to determine the last written page information that can include performing a search of the blocks in the memory for a location of the last written physical page. The system controller may perform the search while the system is powering back up during the TTR, for example. The search may include the system controller issuing a read command for each physical page in the memory block, receiving data from each physical page in response to each read command, and determining whether the physical page is erased or programmed and whether the page is fully or partially programmed in the event the physical page includes multilevel memory cells (MLCs) programmed using multiple passes. In some examples, the system controller may include a page table that facilitates determining the last written page based on the received data. Alternatively, in the absence of a page table, the system controller might search the memory in the logical domain that can involve more reads when compared to reading physical pages, in that a physical page can include multiple logical pages.

A number of embodiments of the present disclosure include sending a single command (e.g., in parallel) from a system controller to one or more memory devices to initiate a LWP search, and results in a response from the memory devices providing the system controller with LWP information. Performing the LWP search internal to the memory devices can reduce I/O traffic (e.g., between the system controller and memory devices) by avoiding sending multiple commands (e.g., read commands) from the controller to the memory devices to perform the LWP search and by avoiding sending the corresponding multiple responses (e.g., read page data) back to the system controller.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more such things. For example, a number of memory devices can refer to one or more memory devices. Additionally, the designators "N", "B", "R", and "S" as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 104 may reference element "04" in FIG. 1, and a similar element may be referenced as 204 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

FIG. 1 is a block diagram of an apparatus in the form of a computing system 100, including at least one memory system 104, in accordance with a number of embodiments of the present disclosure. As used herein, a memory system 104, a system controller (e.g., 215), a memory device (e.g., 210), or a device controller (e.g., 225) might also be separately considered an "apparatus."

Computing system 100 includes a memory system 104 coupled to a host 102 through an interface 106. As used herein, "coupled to" generally refers to a connection between components, which may be an indirect communicative connection or direct communicative connection (e.g., without intervening components), whether wired or wireless, including connections such as, electrical, optical, magnetic, etc. The memory system 104 can be a solid-state storage appliance implemented using a number of SSDs, for example. As described further in association with FIG. 2, the system 104 can include a system controller (e.g., 215) coupled to a memory (e.g., a number of memory devices 210-1 to 210-N) via a suitable memory interface (e.g., 208).

Example hosts 102 can include laptop computers, personal computers, digital cameras, digital recording and playback devices, mobile telephones, PDAs (personal digital assistants), memory card readers, interface hubs, sensors, and Internet-of-Things (IoT) enabled devices, among other host systems. The interface 106 can include a serial advanced technology attachment (SATA), peripheral component interconnect express (PCIe), or a universal serial bus (USB), among other connectors and interfaces. In general, however, host interface 106 can provide an interface for passing control, address, data, and other signals between the memory system 104 and the host 102.

Host 102 can include a number of processors 105 (e.g., parallel processors, co-processors, etc.) coupled to a memory and bus control 107. The processor 105 can be a number of microprocessors, or some other type of controlling circuitry, such as a number of application-specific integrated circuits (ASICs), for example. Other components of the computing system 100 may also have processors. The memory and bus control 107 can have memory and/or other components coupled thereto. In this example, memory and bus control 107 is coupled to a dynamic random access memory (DRAM) 111, a graphic user interface 118, and a peripheral and bus control 109. In this example, peripheral and bus control 109 is coupled to a flash drive 119 via a universal serial bus (USB) interface, a non-volatile memory host control interface (NVMHCI) flash memory 117, and the memory system 104. The memory system 104 can be used in addition to, or in lieu of, a hard disk drive (HDD) in a number of different computing systems. The computing system 100 illustrated in FIG. 1 is one example of such a system; however, embodiments of the present disclosure are not limited to the configuration shown in FIG. 1. The memory system 104 can implement LWP searching as described further herein.

Figure 2:
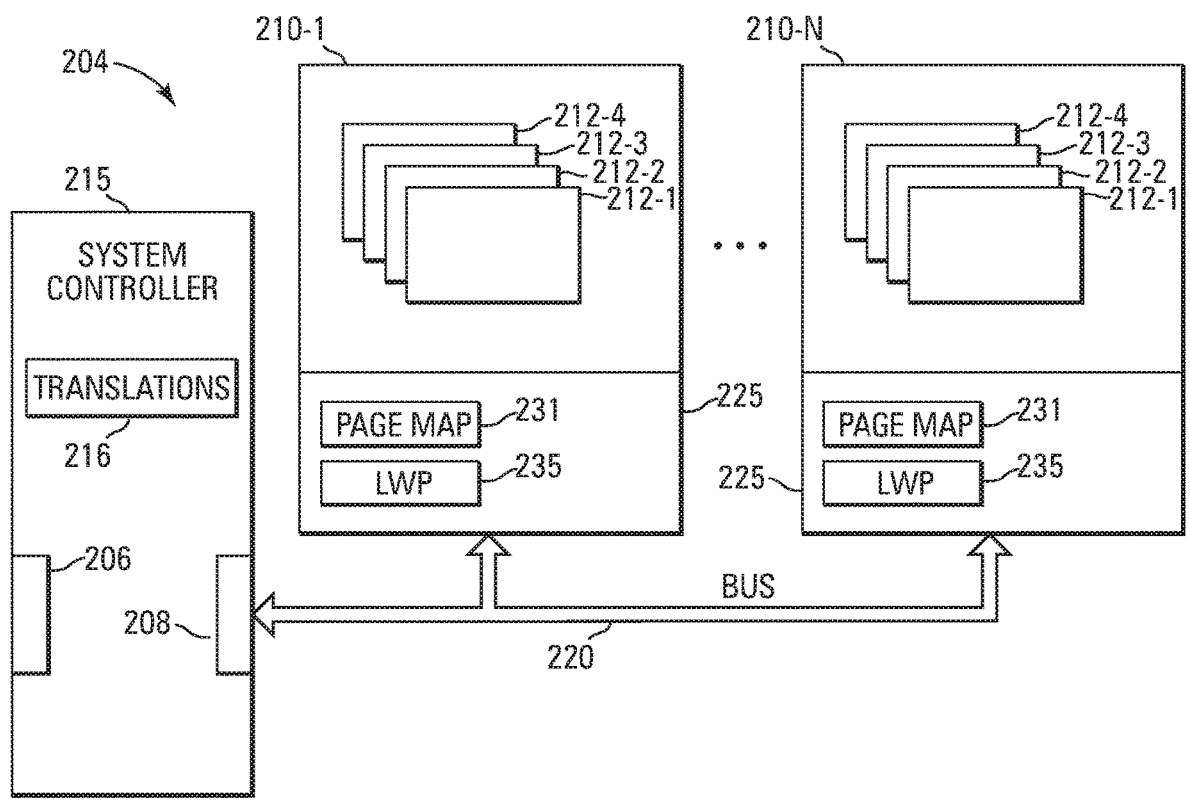
FIG. 2 is a block diagram of an apparatus in the form of a memory system in accordance with a number of embodiments of the present disclosure.

FIG. 2 is a block diagram of an apparatus in the form of a memory system 204 in accordance with a number of embodiments of the present disclosure. As one example, the memory system 204 can be a solid-state drive (SSD). The memory system 204 includes a memory system controller 215 (e.g., memory control circuitry, firmware, and/or software) coupled to a memory (e.g., a number of memory devices 210-1 to 210-N) via a bus 220. The memory devices 210-1 to 210-N may be referred to collectively as memory devices 210 or as memory 210 and may be configured to perform last written page searches in accordance with a number of embodiments of the present disclosure.

The system controller 215 includes a host interface 206 for communication with a host, such as host 102 described in FIG. 1, and a device interface 208, such as a memory interface, for communication with the memory devices 210 via a bus 220. The bus 220 can send/receive various signals (e.g., data signals, control signals, or address signals or a combination thereof) between the memory devices 210 and the system controller 215.

Although the example illustrated in FIG. 2 includes a single bus 220, the memory system 204 can include a separate data bus (DQ bus), control bus, and address bus. The bus 220 can have various types of bus structures including, but not limited to, bus structures related to Open NAND Flash Interface (ONFI), Compact Flash Interface, Multimedia Card (MMC), Secure Digital (SD), CE-ATA, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI). The system controller 215 can be configured to support various data interface types associated with the memory devices 210 (e.g., NV-DDR, NV-DDR2, NV-DDR3, etc.).

The system controller 215 includes a translation component 216, which can be a flash translation layer (FTL), for example, associated with logical to physical address translation between the host and memory 210. For instance, the translation component 216 may include a mapping table of logical block addresses (LBAs) to physical block addresses (PBAs). Although not shown in FIG. 2, system controller 215 might also include an error detection and/or correction component, a wear leveling component, and/or a garbage collection component, among various other components implemented in hardware, firmware, software, or any combination thereof and associated with management of memory 210.

As illustrated in FIG. 2, the memory devices 210 can include a number of memory units 212-1, 212-2, 212-3, and 212-4, which may be referred to collectively as memory units 212 and which provide a storage volume for the memory system 204. The memory units 212 can be dies or chips, which can be referred to as logical units (LUNs). For example, the memory devices 210 can be multi-chip packages (MCPs) that each include a number of dies 212. The dies 212 can be, for example, NAND dies comprising a number of arrays of NAND flash memory cells and associated peripheral circuitry (e.g., write circuitry, read circuitry, I/O circuitry, buffers, etc.).

Figure 3:
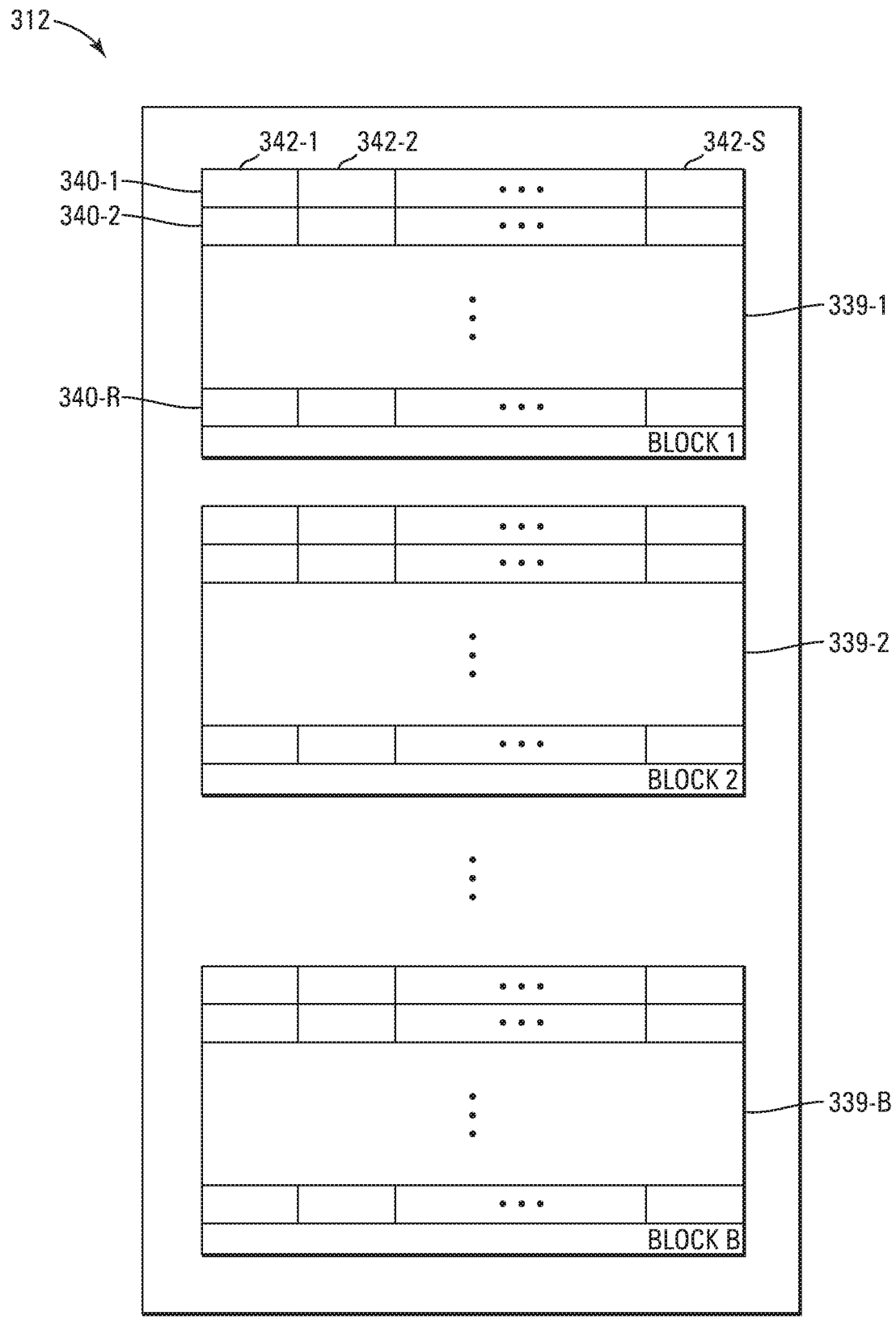
FIG. 3 illustrates an example of a memory unit having groups of memory cells organized as a number of physical blocks in accordance with a number of embodiments of the present disclosure.
Figure 4:
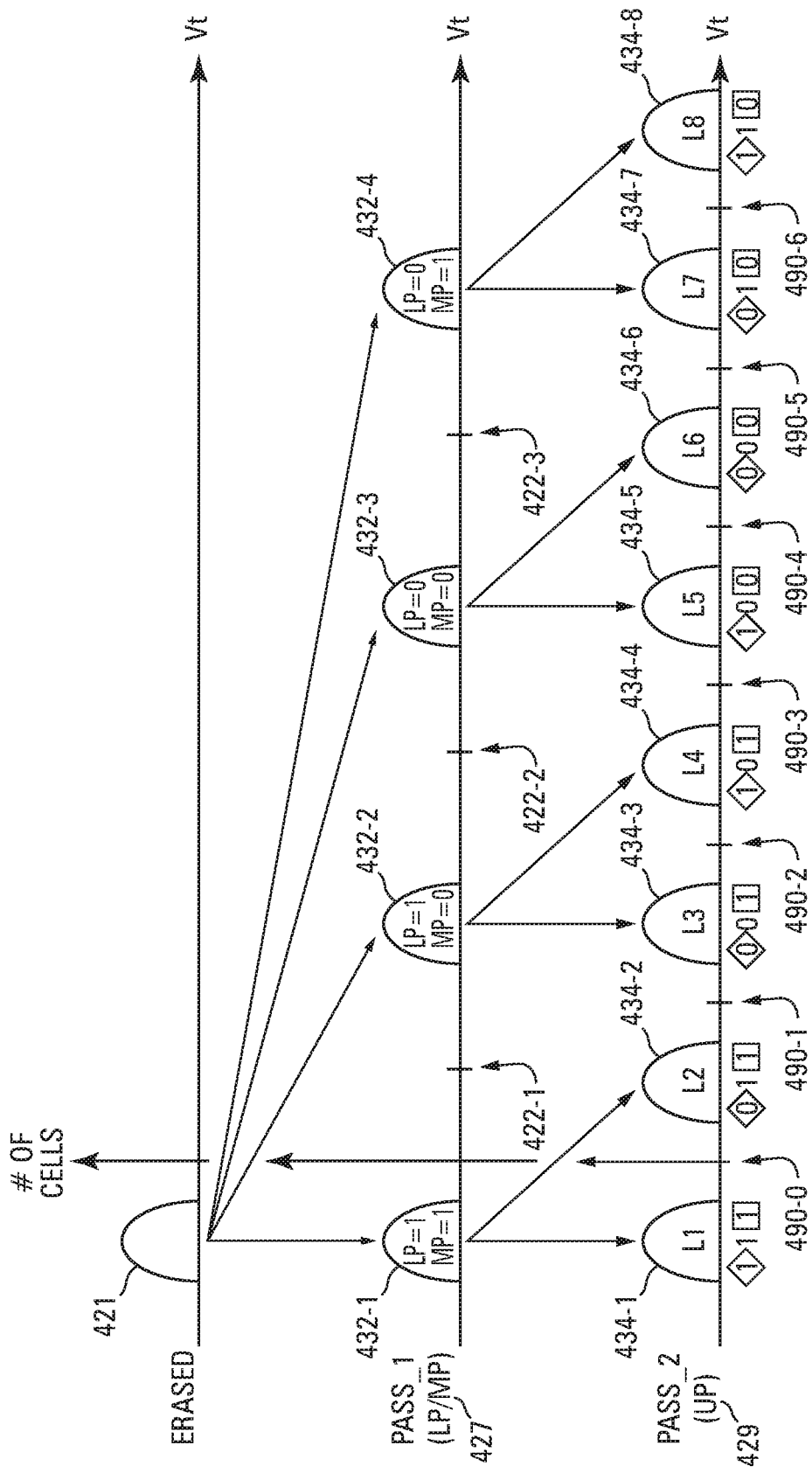
FIG. 4 illustrates a diagram associated with programming memory cells in accordance with a number of embodiments of the present disclosure

As described further in association with FIGS. 3 and 4, the arrays can be NAND flash arrays comprising single level cells (SLCs) configured to store a single data unit (e.g., one bit), and/or multilevel cells (MLCs) configured to store more than one data unit. Additionally, the cells can be programmable via various different programming processes, which can depend on the quantity of data units stored per cell; however, cells configured to store a particular quantity of data units (e.g., 2 bits, 3 bits, 4 bits, etc.) per cell can be programmable via different programming processes. For example, a 3-bit MLC, which may be referred to as a three level cell (TLC) might be programmable via a two-pass programming process (e.g., a 4-8 process in which a first programming pass places the threshold voltage of the cells from an erase state into one of four distributions based on a lower page and middle page data state and in which a second programming pass places the threshold voltage of the cells from the one of four distributions into one of eight distributions based on the upper page data state), or a three-pass programming process (e.g., a 2-4-8 process). In some examples, a two-pass programming process may include a 2-4 process in which a first programming pass places the threshold voltage of the cells from an erase state into one of two distributions based on a lower page data state and in which a second programming pass places the threshold voltage of the cells from the one of two distributions into one of eight distributions based on a middle and an upper page data state.

Embodiments of the present disclosure are not limited to the example shown in FIG. 2. For example, memory systems in accordance with embodiments of the present disclosure can include more or fewer than four memory units (e.g., die) 212 per memory device (e.g., MCP) 210 and are not limited to a particular memory array architecture (e.g., NAND flash, NOR flash, DRAM, PCM, etc.). Also, although one controller 225 is shown per device 210, embodiments can include a controller per memory unit 212 (e.g., one controller per NAND die).

The memory devices 210 of system 204 include an internal device controller 225 configured to control operations (e.g., read, program, erase, etc.) performed on the memory units 212 (e.g., responsive to commands from system controller 215 and/or from a host via system controller 215). The controllers 225 are local to the memory devices 210 and can communicate with the external system controller 215 via bus 220. In some examples, system controller 215 may be referred to as an external controller, in that it is external to memory 210.

As shown in FIG. 2, the internal device controllers 225 include internally stored page map information 231 (e.g., that may be included in page map 531 in FIG. 5A) and last written page (LWP) information 235. As an example, page map information 231 and the last information 235 can be stored (e.g., as tables) in memory located on controller 225 and/or in the arrays of memory units 212. In some examples, system controller 215 might maintain a "shadow" copy of the page map.

As an example, the page map information 231 can indicate a programming order of physical pages within blocks. The programming order can include physical page numbers. The last written page information 235 may include the physical page address (e.g., page number) of the last written page and a completion status, such as the state, of the last written physical page (e.g., whether the page belongs to a group of partially programmed cells, or whether the page is fully programmed). For example, for two pass programming of a TLC, the identifier may include a state resulting from a particular programming pass, such as a 2-state or a 4-state as a result of the first programming pass or an 8-state as a result of the second programming pass.

During operation, system controller 215 reads from and writes to memory devices 210 and keeps track of last written page information (e.g., so that system controller 215 knows which page to write to in a subsequent write). For example, the last written page information can include the locations of the last written physical pages in blocks of the memory devices 210. However, the last written page information can get lost by system 204 due to an asynchronous loss of power, for example.

In various previous systems, the system controller would attempt to determine (e.g., recover) the last written page information during re-powerup of the system (e.g., prior to indicating to the host that the SSD is ready to receive commands). However, in various previous systems, determining the LWP information (e.g., LWP and status) would involve providing multiple read commands to the memory devices 210 (e.g., via bus 220) and receiving the corresponding multiple responses from the devices 210, which would include respective pages of data. Such LWP searching results in a relatively high amount of I/O traffic between the memory devices and the system controller 215, and can result in increased TTRs. Even if the system controller 215 maintained a copy of the page table, performing a LWP search would involve significant I/O traffic (e.g., read commands and corresponding responses across bus 220).

In various embodiments, each of the memory devices 210-1 to 210-N is configured perform its own LWP search. For example, system controller 215 may send a same command to each of the memory devices 210 (e.g., to initiate concurrent LWP searches) responsive to a loss of last written page information by system 204. The command sent to the memory devices 210 to initiate the LWP searching local to the memory devices may be referred to as a LWP search command and may comprise a single read command sequence. For example, during re-powerup, after an asynchronous loss of power, controller 225 may send the LWP search command to the memory devices (e.g., responsive to the power loss event). Responsive to receiving the LWP search command, a controller 225 (e.g., each of controllers 225) may perform a last written page search in each of the blocks of the respective memory device 210 without further intervention from system controller 215. In some examples, each of the controllers 225 may perform last written page search in the respective memory devices concurrently (e.g., in parallel).

As used herein, multiple acts being performed concurrently refers to acts overlapping, at least in part, over a particular time period (e.g., a TTR of the system).

After determining the last written pages, the respective controllers 225 may output the last written page information, corresponding to the last written pages on the respective memory devices 210, to system controller 215. In some examples, as the LWP search command can include a set feature enable command in addition to a read command sequence. Responsive to the LWP search command, controllers 225 may perform a last written page search and output the requested LWP information to system controller 215. As an example, the LWP information output from the controllers 225 may be written to a particular command address location, such as a feature address, which can then be read by system controller 215. For instance, subsequent to receiving the LWP search command from controller 225, no read data is sent to the controller 225 from a memory device 210 before providing the LWP information to the controller 225.

In some examples, the last written page search may include performing an erased page check on particular physical pages that may include reading the particular pages to determine whether they are erased. For example, each physical block may include erase information (e.g., as part of overhead data for the page that may include error correction code (ECC) data), such as flag data (e.g., bits), that indicates whether the physical page is erased. As an example, a bit value of zero may indicate the page is not erased and a bit value of one may indicate the page is erased. For cases in which the physical pages are programmed using multiple passes, the physical page may include status information (e.g., flag data), indicative of the state of programming (e.g., whether the page is fully or partially programmed). As an example, a bit value of zero may indicate the page is partially programmed and a bit value of one may indicate the page is fully programmed. As described in conjunction with FIGS. 5A and 5B, the last written page search may include performing a number of binary searches used to select the particular pages to be read.

The memory devices 210 can be part of a single channel; however, embodiments are not so limited. For example, system controller 215 may be coupled to a plurality of channels each comprising a number of memory devices 210 (e.g., bus 220 may correspond to one or more parallel communication channels). In a number of embodiments, the channels can operate independently such that pages searches described herein can be performed concurrently by devices corresponding to multiple channels and/or concurrently by devices within a single channel.

Providing the ability for each of the memory devices 210 to perform their own last written page searches (e.g., in response to a single command from system controller 215) and outputting the last written page information at the completion of the searches to system controller 215 without further intervention from the system controller 215 can reduce the TTR and I/O traffic compared to using the system controller to perform the last written pages by issuing numerous commands and receiving information from each physical or logical page, as is done in previous approaches. Moreover, the previous approaches may involve performing the searches on and receiving the last written page information from the memory devices coupled to the system controller over a single channel (e.g., bus) serially. This, for example, can result in large amounts of I/O traffic on the channel (e.g., resulting in congestion that could reduce throughput). Using each of the memory devices 210 to perform their own last written page searches allows the searches to be conducted in parallel by the respective memory devices 210 coupled to the system controller over a single channel and can result in reduced I/O traffic on the channel compared to the previous approaches.

FIG. 3 illustrates an example of a memory unit 312 having groups of memory cells organized as a number of physical blocks 339-1 (BLOCK 1), 339-2 (BLOCK 2), . . . , 339-B (BLOCK B), in accordance with a number of embodiments of the present disclosure. The memory unit 312 can be a memory unit, such as memory units 212 described in FIG. 2. The memory cells of memory unit 312 can be, for example, non-volatile floating gate flash memory cells having a NAND architecture. However, embodiments of the present disclosure are not limited to a particular memory type.

The memory blocks 339-1 to 339-B can be referred to collectively as blocks 339 and can be operated as SLC and/or MLC cells, for instance. As an example, the number of physical blocks in an array of memory unit 312 may be 128 blocks, 512 blocks, or 1,024 blocks, but embodiments are not limited to a particular number of physical blocks. In some examples, the blocks 339 may be arranged in a plurality of decks. As an example, one or more "dummy" access lines (e.g., word lines) might separate the decks from each other.

In the example shown in FIG. 3, each physical block 339 includes memory cells which can be erased together as a unit (e.g., the cells in each physical block can be erased concurrently as an erase unit). As shown in FIG. 3, each physical block 339 comprises a number of physical rows 340-1, 340-2, . . . , 340-R of memory cells that can each be coupled to a respective addressable access line. The number of rows in each physical block can be 32, 64, or 128, but embodiments are not limited to a particular number of rows, which can be referred to collectively as rows 340, per block 339.

Each row 340 can comprise a number of physical pages of cells that may include erase information and status information, if applicable. A physical page of cells can refer to a number of memory cells that are programmed and/or read together (e.g., concurrently) or as a functional group. In the embodiment shown in FIG. 3, each row 340 can comprise one physical page of cells. However, embodiments of the present disclosure are not so limited. For instance, each row 340 can comprise multiple physical pages of cells (e.g., an even page associated with cells coupled to even-numbered bit lines, and an odd page associated with cells coupled to odd numbered bit lines). Additionally, as described further in association with FIG. 4, for embodiments including multilevel cells, a physical page can store multiple logical pages of data with each cell in a physical page contributing a bit toward a logical lower page, a bit toward a logical upper page, and one or more bits toward a respective number of logical intermediate pages.

In some examples, as described further in conjunction with FIG. 5A, a memory block may be arranged in a plurality of columns of pages, such as addressable sub-blocks of pages. For example, each sub-block within a block may be identified by an address, such as a sub-block address.

For example, a physical page address may include (e.g., may be identified by) an access line address and a sub-block address.

In the example shown in FIG. 3, a physical page corresponding to a row 340 can store a number of sectors 342-1, 342-2, . . . , 342-S of data (e.g., an amount of data corresponding to a host sector, such as 512 bytes). The sectors 342 may comprise user data as well as overhead data, such as error correction code (ECC) data and logical block address (LBA) data. It is noted that other configurations for the physical blocks 339, rows 340, and sectors 342 are possible. For example, rows 340 can each store data corresponding to a single sector which can include, for example, more or less than 512 bytes of data.

FIG. 4 illustrates a diagram associated with programming memory cells in accordance with a number of embodiments of the present disclosure. In this example, the memory cells are TLCs each being programmable to one of eight data states (e.g., L1 to L8) assigned a different respective 3-bit bit pattern (e.g., 111, 011, 001, 101, 100, 000, 010, and 110). In a number of embodiments, each of the bits in the 3-bit stored bit patterns correspond to a different logical page of data. For instance, the least significant bit (LSB) (right most bit shown as boxed in FIG. 4) can correspond to a first logical page of data (e.g., a lower page), the middle bit can correspond to a second logical page of data (e.g., a middle page), and the most significant bit (MSB) (left most bit as indicated by a diamond symbol in FIG. 4) can correspond to a third logical page of data (e.g., an upper page).

However, embodiments are not limited to multilevel memory cells storing three bits of data. For instance, a number of embodiments can include memory cells configured to store more or fewer than three bits of data and/or a fractional number of bits of data per cell, and embodiments are not limited to the particular encoding assigned to the data states L1 to L8.

The diagram shown in FIG. 4 illustrates threshold voltage (Vt) distributions associated with programming memory cells (e.g., NAND flash cells) in accordance with a two-pass programming process (e.g., a 4-8 two-pass programming process) that includes a first programming pass (PP_1) 427 by which the lower page and middle page (LP/MP) are programmed, and a second programming pass (PP_2) 429 by which the upper page (UP) is programmed.

Threshold voltage (Vt) distribution 421 represents erased memory cells. The first programming pass 427 includes adjusting the Vt of the memory cells (e.g., via programming pulses applied to a selected word line) to one of four levels represented by Vt distributions 432-1, 432-2, 432-3, and 432-4. The voltage levels are represented by Vt distributions, which can reflect a statistical average Vt level of cells programmed to a particular level. In this example, cells whose lower page is to store a bit value of "1" (e.g., LP=1) and whose middle page is to store a bit value of "1" (e.g., MP=1) are programmed to distribution 432-1 during the first programming pass 427, cells whose lower page is to store a bit value of "1" (e.g., LP=1) and whose middle page is to store a bit value of "0" (e.g., MP=0) are programmed to distribution 432-2 during pass 427, cells whose lower page is to store a bit value of "0" (e.g., LP=0) and whose middle page is to store a bit value of "0" (e.g., MP=0) are programmed to distribution 432-3 during pass 427, and cells whose lower page is to store a bit value of "0" (e.g., LP=0) and whose middle page is to store a bit value of "1" (e.g., MP=1) are programmed to distribution 432-4 during pass 427.

The second programming pass 429 includes adjusting the Vt of the memory cells (e.g., via programming pulses applied to a selected word line) to one of eight levels represented by Vt distributions 434-1 to 434-8, which correspond to data states L1 to L8, respectively, with each one of data states L1 to L8 indicating a different 3-bit stored bit pattern. In this example, cells programmed to data state L1 store data "111," cells programmed to data state L2 store data "011," cells programmed to data state L3 store data "001," cells programmed to data state L4 store data "101," cells programmed to data state L5 store data "100," cells programmed to data state L6 store data "000," cells programmed to data state L7 store data "010," and cells programmed to data state L8 store data "110."

The diagram illustrated in FIG. 4 illustrates a number of read voltages 490-0, 490-1, 490-2, 490-3, 490-4, 490-5, and 490-6 (referred to generally as read voltages 490) associated with reading the bits of the three respective stored pages. A number of read strobes (e.g., using a number of the read voltages 490 applied to the selected word line) may be required in association with a reading a particular page of data. For instance, in this example, the encoding is such that a single read strobe (e.g., at read voltage 490-3) can be used to determine whether the lower page of the cell is a "0" or a "1" (e.g., a single Vt detection operation using read voltage 490-3). Also, in this example, two read strobes must be performed in order to decode the middle page (e.g., one strobe at read voltage 490-1 and one strobe at read voltage 490-5). In this example, the encoding is such that four read strobes must be performed in order to decode the upper page (e.g., strobes at read voltages 490-0, 490-2, 490-4, and 490-6).

In some examples, memory cells of memory units, such as memory units 212 shown in FIG. 2 can be configured as SLC or MLC cells. The MLC configurations can be 2-bit, 3-bit, or 4-bit configurations, for instance. The page mapping (e.g., programming order of pages) can vary based on the particular MLC configuration. Additionally, the programming processes corresponding to a particular MLC can vary. For example, a 3-bit MLC configuration can be programmed in accordance with a one-pass, two-pass, or three-pass programming process. In some examples, if only the first programming pass 427 has been performed, the status information in the corresponding physical page may indicate the physical page is partially programmed, and if the second programming pass 429 has been performed, the status information may indicate the physical page is fully programmed.

FIG. 5A illustrates an example page map 531 associated with last written page searching in accordance with a number of embodiments of the present disclosure. FIG. 5B illustrates a table indicating erase status of physical pages corresponding to the page map shown in FIG. 5A. The page map 531 can correspond to page map information 231 in the respective memory devices 210 shown in FIG. 2, for example. In examples involving a plurality of decks per block, there may be a page map 531 for each of the plurality of decks.

In the example shown in FIG. 5A, the page map 531 is in the form of a table and corresponds to a memory in which a block of memory cells comprises 6 sub-blocks with 11 word lines. As such, each block comprises 66 physical pages. Each column 552-0 through 552-5 of the table 531 corresponds to a respective sub-block (e.g., "SB0" through "SB5") and each row 550-0 through 550-10 of the table 531 corresponds to a respective word line (e.g., "WL0" through "WL10"). The entries within the table 531 indicate respective page numbers for the 66 physical pages within the block (numbered "0" through "65"). Accordingly, the table 531 indicates the physical location (e.g., sub-block address and word line address) of each physical page within the block. For example, page "0" corresponds to a physical page at word line WL0 within sub-block SB0, and page "65" corresponds to a physical page at word line WL10 within sub-block SB5.

In the example of FIG. 5A, the word lines WL0 through WL10 can be common to the sub-blocks SB0 through SB5. For example, pages "60" to "65" can all be coupled to a same word line (e.g., WL10). However, the 11 word lines of the respective sub-blocks SB0 through SB5 may be different word lines such that page "60" might be coupled to the $11^{th}$ word line (WL10) within sub-block SB0 and page "65" might be coupled to a separate word line within sub-block SB5 (e.g., the $11^{th}$ word line within sub-block SB5).

Table 560 illustrates an example of erase status, at a particular point in time, for the block described in FIG. 5A. For example, table 560 indicates whether each of the 66 pages corresponding to table 531 is currently erased (e.g., indicated by "E") or programmed, at least partially (e.g., indicated by "P"). The table 560 can represent the erase status of the block subsequent to an asynchronous power loss event in which LWP information is lost by the memory system.

The below discussion describes performing a last written page search (e.g., using table 531) in accordance with embodiments of the present disclosure in order to determine which physical page of the 66 physical pages of the block was the last physical page written as well as other status information associated with the last written physical page. The example described below involves performing a number of binary searches to determine the LWP. For example, a first binary search can be performed to determine a particular last programmed word line, and a second binary search can be performed to determine a particular last programmed sub-block. As described below, each iteration of the binary search may include performing an erase page check, which can include performing a page read operation.

It will be appreciated that binary searches are known and that one of ordinary skill in the art will be familiar with how a binary search is performed. Accordingly, a detailed explanation of how binary searches may be implemented is not provided. Further, it is noted that although the example provided herein uses a binary search, embodiments of the present disclosure are not limited to a particular type of search to determine LWP information.

A LWP search using the page map information shown in FIGS. 5A and 5B can be initiated via a LWP search command initiated by a system controller (e.g., 215) responsive to a loss of LWP information of a system (e.g., system 104). The LWP search command can be executed by one or more memory devices (e.g., 210-1 to 210-N) without further intervention from the system controller 215 (e.g., without providing subsequent commands such as page read commands to the memory devices 210). The search may commence by performing a word line search (e.g., a binary search of the word lines WL0 through WL10) for a particular one of the sub-blocks (e.g., sub-block SB0). Since the physical pages of a block may be programmed sequentially (e.g., starting at page "0" and ending at page "66"), a binary word line search of one of the sub-blocks can be sufficient to obtain the word line corresponding to the LWP. However, if a memory device comprises multiple decks of sub-blocks, a separate binary search of the word lines may be performed on a sub-block from each of the decks (e.g., to determine which deck includes the LWP).

The binary search of the word lines (e.g., of a selected sub-block such as sub-block SB0) may include setting a start pointer to the first word line (e.g., WL0) and an end pointer to the last word line (e.g., WL10). An erase check is performed on the page corresponding to the selected sub-block (e.g., SB0) and to the word line corresponding to the start pointer (e.g., WL0), which is page "0" as shown in table 531. The erase check of page "0" includes reading the page, whose corresponding data (e.g., or metadata such as an erase state flag) indicates whether or not the page is erased. In cases in which the pages of a block are programmed sequentially, a determination that the first word line (WL0) of the first sub-block (SB0) is erased can indicate that the block is erased (e.g., all pages of the block are erased).

If, as in this example, page "0" is determined to be programmed, as indicated by the "P" in table 560, then an erase page check is performed on the page corresponding to the selected sub-block (SB0) and to the word line corresponding to the end pointer (WL10), which is page "60" in this case. If it is determined that page "60" is programmed, then it may be the last written page. Accordingly, if page "60" is programmed, a binary search of the sub-blocks SB0 through SB5 may be performed to determine which of the sub-blocks includes the last written page.

If, as in this example, page "60" is determined to be erased, as indicated by the "E" in table 560, then, in accordance with binary searching, one of the start and end pointers is moved to remove half (or about half) of the word lines from the next binary search iteration. In this example, the next iteration of the binary search involves moving the start pointer from WL0 to WL5 (with the end pointer remaining at WL10), and performing an erase check on the page coupled to word line WL5, which is page "30" as shown in table 531.

Since, in this example, page "30" is programmed, as indicated by the "P" in table 560, the start pointer remains at WL5 and the end pointer is moved from WL10 to WL7 in accordance with the binary search process for the next iteration. An erase check is then performed on the page that is coupled to word line WL7 (of sub-block SB0), which is page "42" as shown in table 531.

In this example, page "42" is determined to be erased, as indicated by the "E" in table 560, and the start pointer may be updated from word line WL5 to WL6. In this example, since page "30" (coupled to WL5) was determined to programmed and page "42" (coupled to WL7) was determined to be erased, an erase page check on page "36" (e.g., the page coupled to WL6) will determine whether page "30" or page "36" is the last written page.

In this example, an erase page check on page "36" reveals that page "36" is programmed, as indicated by the "P" in table 560. Accordingly, page "36" is determined to be the last written page in the selected sub-block (e.g., SB0) and the binary search of the word lines concludes (e.g., since the start pointer and end pointers have merged to within one word line), and word line WL6 is determined to be the word line coupled to the last written page of the block.

Responsive to determining the particular word line corresponding to the last written page of a block (e.g., WL6 in this example), a subsequent binary search of the sub-blocks SB0 through SB5 coupled to word line WL6 can be performed to determine in which particular sub-block the last written page of the block is located.

The binary search of sub-blocks SB0 to SB5 coupled to word line WL6 may include setting a start pointer to the first sub-block (e.g., sub-block SB0) and an end pointer to the last sub-block (e.g., sub-block 5). An erase check may be performed on the page in sub-block 5 (e.g., page "41"). If, as in this example, page "41" is determined to be erased, as indicated by the "E" in table 560, then, in accordance with binary searching, one of the start and end pointers is moved to remove half (or about half) of the sub-blocks for the next binary search iteration. In this example, the next iteration of the binary search involves moving the end pointer from sub-block SB5 to sub-block SB2 (with the start pointer remaining at sub-block SB0), and performing an erase check on the page in sub-block SB2, which is page "38" as shown in table 531.

In this example, page "38" is determined to be erased, as indicated by the "E" in table 560, and the start pointer may be updated from sub-block SB0 to sub-block SB1. In this example, since page "36" in sub-block SB0 (e.g., coupled to word line WL6) was determined to be programmed, and page "38" in sub-block 2 (e.g., coupled to word line WL6) was determined to be erased, an erase page check on page "37" in sub-block SB1 will determine whether page "36" or page "37" is the last written page. In this example, an erase page check on page "37" reveals that page "37" is programmed, as indicated by the "P" in table 560. Accordingly, page "37" is determined to be the last written page in the block.

In examples in which the pages are programmed using a single pass, the access line address WL6 and the sub-block address SB1 of last written page "37" are output to system controller 215 as last written page information (e.g., identified by the feature address). In examples in which the pages are programmed using multiple passes, the status information of last written page "37" is checked to determine whether last written page "37" is partially or fully programmed, and this information is included with the last written page information.

In the various disclosed embodiments, the LWP searches are performed local to the memory devices coupled to the system controller without system controller interaction. The memory device performs an LWP search internally by itself and returns the result of the search (e.g. LWP information) to the system controller in response to receiving a command output by the system controller in response to a power loss event. This can provide benefits, such as reducing a TTR of the memory system and/or input/output (I/O) traffic within the memory system compared to previous approaches in which the system controller itself determines the LWP information externally to the memory device.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
responsive to a loss of last written page information by a memory system, initiating a last written page search to determine last written page information of a plurality of memory devices, wherein the last written page search is initiated via a single command from a controller of the memory system to a plurality of channels within the memory system and to the plurality of memory devices within each channel concurrently;
responsive to receiving the single command, performing the last written page search on the plurality of memory devices and the plurality of channels concurrently;
providing the last written page information to the controller;
wherein the last written page information indicates whether memory cells of a last written page are fully programmed;
wherein the last written page search commences by performing a word line search for determining a particular word line using a binary search of word lines for a particular one of a group of sub-blocks;
wherein the binary search of the word lines includes setting a start pointer to a first word line and an end pointer to a last word line and performing an erase check of the particular one of the group of sub-blocks; and
responsive to determining the particular word line corresponding to a last written page of a block, performing a subsequent binary search of sub-blocks coupled to the particular word line to determine a particular sub-block in which the last written page of the block is located.

2. The method of claim 1, wherein subsequent to receiving the command, no read data is sent to the controller from the plurality of memory devices before providing the last written page information to the controller.

3. The method of claim 1, wherein performing the last written page search comprises determining an access line address and a sub-block address of the last written page without further intervention by the controller.

4. The method of claim 3, wherein performing the last written page search further comprises determining a status of the last written page.

5. The method of claim 4, wherein determining the status of the last written page comprises reading status information stored in the last written page.

6. The method of claim 1, wherein the plurality of memory devices maintains a page map that provides a physical page address for each of a plurality of combinations of an access line address and a sub-block address.

7. The method of claim 1, wherein the loss of last written page information by the memory system is caused by an asynchronous power loss event.

8. The method of claim 1, wherein the plurality of memory devices comprises a plurality of decks of memory cells, wherein performing the last written page search comprises determining which of the plurality of decks comprises the last written page.

9. The method of claim 1, wherein the command is a last written page search command.

10. An apparatus, comprising:
a system controller;
a plurality of memory devices, within a plurality of channels operating independently external to the system controller and comprising respective internal controllers;
wherein the system controller is configured to send a single command to the respective internal controllers within the plurality of channels and the plurality of memory devices concurrently responsive to a loss of last written page information;
wherein the respective internal controllers are configured to:
concurrently perform a last written page search on the plurality of channels and the plurality of memory devices to determine last written page information of the plurality of memory devices and the plurality of channels responsive to receiving the command; and
provide the determined last written page information for each of the plurality of memory devices and the plurality of channels to the system controller;
wherein the last written page information indicates whether memory cells of a last written page are fully programmed;
wherein the last written page search commences by performing a word line search for determining a particular word line using a binary search of word lines for a particular one of a group of sub-blocks;
wherein the binary search of the word lines includes setting a start pointer to a first word line and an end pointer to a last word line and performing an erase check of the particular one of the group of sub-blocks; and
responsive to determining the particular word line corresponding to a last written page of a block, performing a subsequent binary search of sub-blocks coupled to the particular word line to determine a particular sub-block in which the last written page of the block is located.

11. The apparatus of claim 10, wherein the respective internal controllers comprise a page map.

12. The apparatus of claim 10, wherein data stored in the last written page comprises information which indicates whether the memory cells of the last written page are fully programmed.

13. The apparatus of claim 10, wherein the respective internal controllers are configured to assign an indicator to the last written page information that indicates the last written page information to the system controller.

14. The apparatus of claim 13, wherein the system controller is configured to read the last written page information based on the indicator.

15. The apparatus of claim 10, wherein the system controller is configured to read the last written page information.

16. An apparatus, comprising:
a system controller comprising a device interface and a host interface;
a plurality of memory devices within a plurality of channels operating independently coupled to the system controller by the device interface, the plurality of memory devices each comprising:
an internal controller; and
a block of memory cells comprising a plurality of sub-blocks, each sub-block comprising physical pages respectively coupled different ones of a plurality of word lines;
wherein the system controller is configured to send a single command concurrently to the respective internal controllers of the plurality of channels and the plurality of memory devices within each channel responsive to a loss of last written page information;
wherein each of the internal controllers is configured to:
responsive to receiving the command, perform an erased page check on at least some of the pages of the block to determine a last written page; and
provide, to the system controller, last written page information for each of the plurality of memory devices and the plurality of channels that includes an address corresponding to the last written page;
wherein the last written page information indicates whether the memory cells of the last written page are fully programmed;
wherein determining the last written page includes commencing a last written page search by performing a word line search for determining a particular word line using a binary search of word lines for a particular one of the plurality of sub-blocks;
wherein the binary search of the word lines includes setting a start pointer to a first word line and an end pointer to a last word line and performing the erased page check of the particular one of the plurality of sub-blocks; and
responsive to determining the particular word line corresponding to a last written page of a block, performing a subsequent binary search of sub-blocks coupled to the particular word line to determine a particular sub-block in which the last written page of the block is located.

17. The apparatus of claim 16, wherein the last written page information includes a feature address.

18. The apparatus of claim 16, wherein the last written page information provided to the system controller includes a status of the last written page as determined by the respective internal controllers.

19. The apparatus of claim 16, wherein data stored in the last written page comprises information which indicates whether the memory cells of the last written page are fully programmed.

20. The apparatus of claim 16, wherein the erased page check performed on the at least some of the pages of the block comprises reading an erase status from the at least some of the pages.

21. The apparatus of claim 16, wherein the plurality of memory devices is coupled to the system controller via a plurality of channels; and wherein at least two of the memory devices are configured to perform an erased page check in parallel.

22. The apparatus of claim 16, wherein the address corresponding to the last written page comprises an access line address and a sub-block address.

* * * * *